United States Patent [19]

Korten et al.

[11] Patent Number: 4,897,822

[45] Date of Patent: Jan. 30, 1990

[54] PLL SONIC BILGE PUMP SWITCH

[76] Inventors: Jerome B. Korten, 242 W. 104 #6WR, New York, N.Y. 10025; Chauncey F. Korten, Box 459, Block Island, R.I. 02807

[21] Appl. No.: 309,075

[22] Filed: Feb. 10, 1989

[51] Int. Cl.$^4$ .............................................. G01S 3/80
[52] U.S. Cl. ................... 367/124; 367/908; 73/290 V
[58] Field of Search ................. 367/908, 96, 124; 73/290 V; 340/621

[56] References Cited

U.S. PATENT DOCUMENTS

| | | | |
|---|---|---|---|
| 3,937,168 | 2/1976 | Doak | 114/183 |
| 3,941,519 | 3/1976 | McCauley | 417/560 |
| 3,946,694 | 3/1976 | Belsky | 114/183 |
| 4,044,606 | 8/1977 | LeBlanc et al. | 73/67.7 |
| 4,103,265 | 7/1978 | Siiberg | 335/205 |
| 4,139,463 | 2/1979 | Murphy et al. | 210/73 |
| 4,145,914 | 3/1979 | Newman | 367/908 |
| 4,171,932 | 10/1979 | Miller | 417/36 |
| 4,196,758 | 4/1980 | Weston | 141/83 |
| 4,221,004 | 9/1980 | Combs et al. | 367/908 |
| 4,223,190 | 9/1980 | Olson | 200/84 |
| 4,275,995 | 6/1981 | Taylor | 417/40 |
| 4,276,454 | 6/1981 | Zathan | 200/61.05 |
| 4,341,178 | 7/1982 | Price | 114/183 |
| 4,365,124 | 12/1982 | Robinson | 200/81.5 |
| 4,395,605 | 7/1983 | Weston | 200/84 |
| 4,399,338 | 8/1983 | Jones | 200/84 |
| 4,468,546 | 8/1984 | Jones | 200/84 |
| 4,635,582 | 1/1987 | Nishida | 114/360 |
| 4,645,426 | 2/1987 | Hartley et al. | 417/38 |
| 4,829,493 | 5/1989 | Bailey | 367/908 |

FOREIGN PATENT DOCUMENTS

| | | |
|---|---|---|
| 813497 | 1/1958 | United Kingdom . |
| 1194693 | 7/1967 | United Kingdom . |
| 1361052 | 7/1974 | United Kingdom . |
| 2179738 | 3/1987 | United Kingdom . |
| WO82/00028 | 5/1982 | World Int. Prop. O. . |

Primary Examiner—Thomas H. Tarcza
Assistant Examiner—Daniel T. Pihulic
Attorney, Agent, or Firm—Weingarten, Schurgin, Gagnebin & Hayes

[57] ABSTRACT

An apparatus for activating and deactivating a bilge pump in a marine vessel in response to the presence or absence of water or other fluid in the bilge area wherein a pair of acoustic transducers are mounted in proximate and opposed relationship to one another such that a first transducer, the generator transducer, transmits acoustic waves to a second transducer, the receiver transducer, across a designated narrow channel. The apparatus operates on the principle that acoustic waves transmit greater energy in a dense transmission medium such as water or other liquid. The sensitivity of the transducer pair and its associated electronic circuitry is adjusted such that the transmitted acoustic signal is detected at the receiver transducer when the signal is transmitted through liquid and the signal fails to reach a detectable level at the receiver transducer when the signal is transmitted through air. The detected signal triggers electronic circuitry operating a relay coil which switches power to the bilge pump. The circuitry of the present invention also incorporates a time delay circuit creating a damping effect on the switching control to prevent switching during sudden movement of water.

10 Claims, 2 Drawing Sheets

PLL SONIC BILGE PUMP SWITCH

FIELD OF THE INVENTION

The present invention relates to bilge pump switches and, more particularly, to a sonic bilge pump switch utilizing principles of acoustic wave propagation to activate and deactivate a bilge pump motor.

BACKGROUND OF THE INVENTION

Bilge pump switches which activate and deactivate a bilge pump motor depending on the presence or absence of liquid in the bilge hold of a marine vessel are well known for use in recreational boating. Historically, such switches have been made in the form of float operated switches involving moving parts which are subject to malfunction due to corrosion and the presence of contaminants in the liquid being sensed. Float switch systems possess additional disadvantages in that they are sensitive to orientation of mounting, and they are also inherently bulky.

Other bilge pump switches have been produced based on pressure switch systems typically comprising a sealed chamber covered by a movable membrane. As with float switches, such systems contain moving parts susceptible to mechanical malfunction and also include inherent disadvantages such as a proclivity toward pressure chamber leaks due to punctures in the membrane and sensitivity to temperature variations.

Due to the problems discussed above, it has become desirable to employ switching means controlled by non-mechanical devices which sense fluid levels using electronic detection means. To this end, some switching devices have been designed with probes which utilize the conductivity of the fluid being sensed in contact with the probes creating an electrical path to activate the bilge pump. However, these devices present their own problems with respect to corrosion of the probes and the more noteworthy problem of spark-induced combustion due to the potential presence of floating fuel in the bilge area.

The loss of property as well as lives from accidents which could be prevented serves as strong motivation for producing a safe and dependable switch control means for operating a bilge pump. Accordingly, the invention disclosed herein is directed toward the problems attendant with bilge pump systems by providing a non-mechanical switching means operating on the principles of acoustic wave propagation. The inventor notes that the present invention is not limited to bilge pumping systems but is also useful in other applications of pumping and/or liquid level sensing systems.

SUMMARY OF THE INVENTION

The present invention discloses a sonic bilge pump switching system which provides switching control to a bilge pump depending on the presence or absence of liquid or other fluid in the bilge hold of a marine vessel. In accordance with the invention disclosed herein, a pair of acoustic transducers are mounted in proximate and opposing relation to one another such that a first transducer, a generator transducer, generates acoustic waves and transmits them to a second transducer, a receiver transducer. The switch operates on the principle that acoustic waves transmit greater energy in a dense transmission medium such as water or some other liquid than in a lighter transmission medium such as air. Thus, by using electronic circuitry to adjust the sensitivity of the transducer pair such that transmitted acoustic waves are detected at the receiver transducer when the waves are transmitted through liquid and the waves are not detected at the receiver transducer when the waves are transmitted through air, the present invention is operative to activate and deactivate a switch which controls power to a bilge pump depending on the presence or absence of fluid in the bilge hold which acts as the transmission medium.

The present invention incorporates an oscillator and a phase locked loop detector coupled to the acoustic transducer pair to produce an output signal of predetermined frequency from the generator transducer and to generate a response to the receipt of that predetermined frequency by the receiver transducer. This response activates associated electronic circuitry allowing current to travel through a relay switch, ultimately controlling power to the bilge pump. The phase locked loop detector allows the circuit sensitivity to be limited to the precise frequency transmitted by the transmitter transducer, thereby eliminating switch response to extraneous sound waves (e.g., engine noise or vibrations) which might create false switching in h absence of water or other fluid.

The electronic circuitry of the present invention also incorporates a time delay network to dampen the response time between the fluid detection circuitry and the relay switching circuitry. This time delay network enhances the performance of the apparatus by preventing switching during sudden movement of water such as when water is sloshing or splashing about the bilge hold. In addition, this element permits the pump to remain activated for a short period of time after fluid is no longer present between the transducer pair to allow for the removal of any water which may be present below the level of the transducer pair.

The switch of the present invention is embodied within an acoustically insulated and liquid impermeable housing specifically shaped to create a unidirectional flow of water in the presence of wave action. This shape harnesses the motion of water to remove any object that may float into the channel separating the transducer pair. Additionally, the housing is shaped to function in combination with a mounting plate, thereby permitting the user to make adjustments to the placement of the detector and allowing the user to remove the transducer pair for inspection and/or cleaning.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
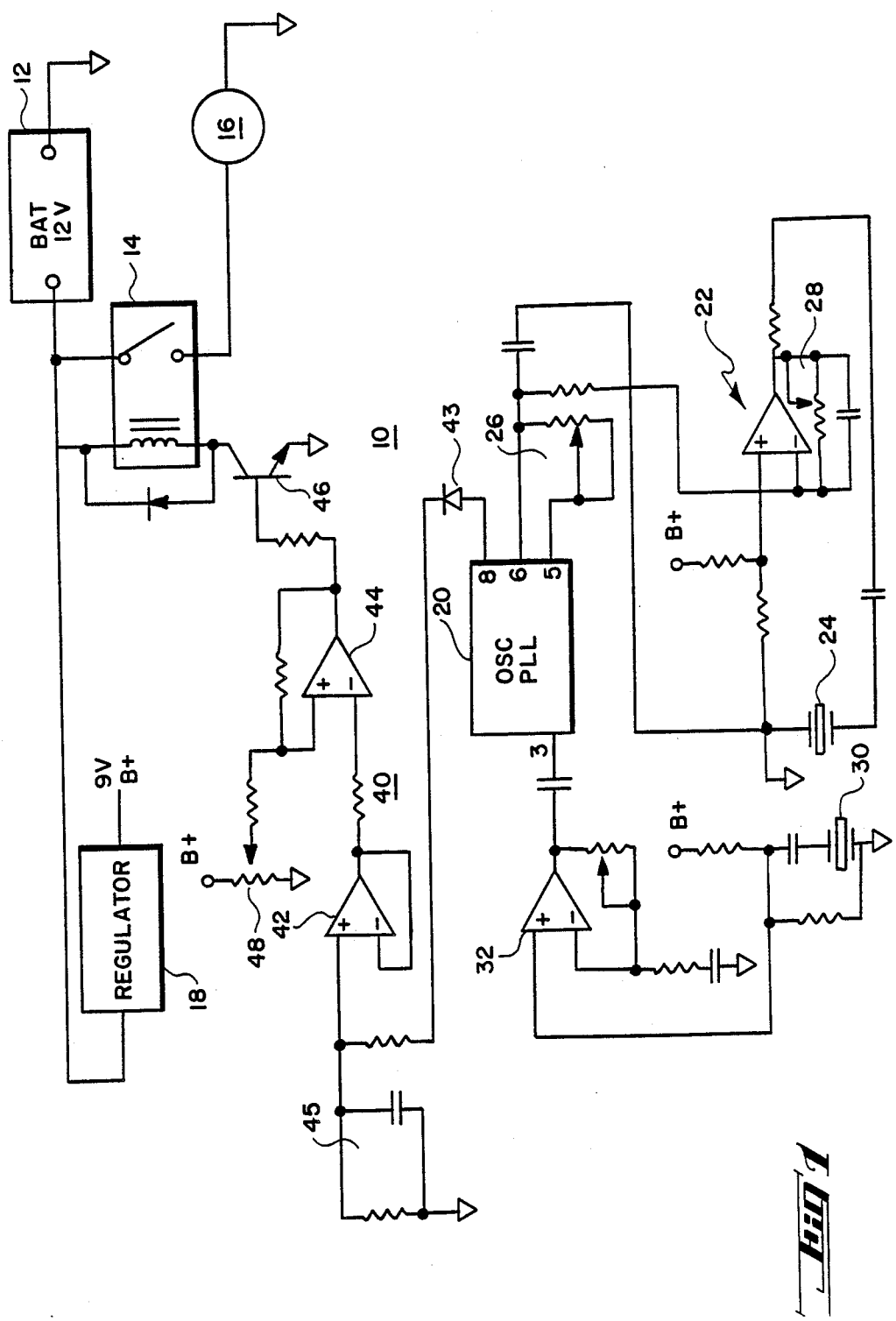
FIG. 1 is a schematic diagram o the electronic circuit of the present invention.

FIG. 1 illustrates a schematic diagram of the electronic circuit 10 of the sonic bilge pump switch disclosed in the present invention. This electronic circuit 10 controls a relay switch 14 connecting a pump motor 16 to a common 12 volt battery 12 normally associated with the electrical system of a boat. This battery 12 also provides the supply voltage for the electronic circuit 10 through a regulator 18 providing 9 volts output and 3 volts safety margin.

The circuit of the present invention incorporates an oscillator within a chip 20 (typically an NE567) wherein the frequency of th oscillator chip 20 is set by a potentometer 26 typically to a frequency of 20–30 Khz. The output of the oscillator on line 6 of chip 20 is capacitavely coupled to a generator amplifier 22 such that the output of amplifier 22 provides an electrical input to a generator transducer 24 such as a piezo electric crystal. This generator transducer 24 converts this electrical signal to a vibrational output creating sound waves of a corresponding frequency, that frequency preferably is at a resonant frequency or harmonic thereof of the generator transducer 24. The amplitude of the sound waves is set by a potentiometer 28 in the feed back loop of amplifier 22 which varies the gain of amplifier 22.

Figure 2:
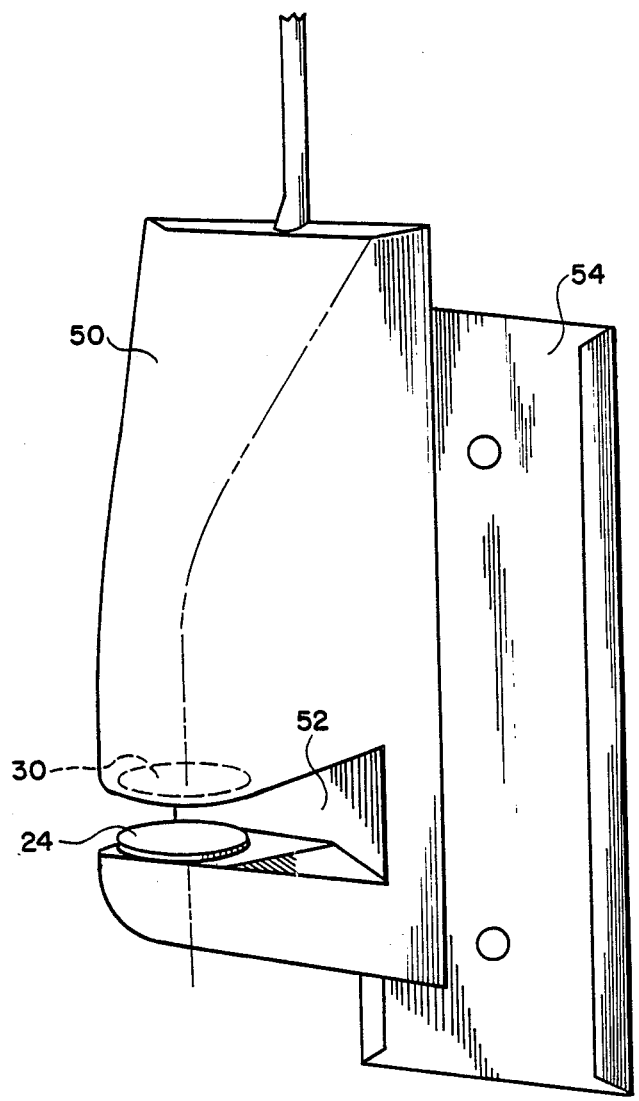
FIG. 2 is a perspective view of a preferred embodiment of the sonic bilge pump switch of the present invention.

The sound waves produced by the generator transducer 24 are transmitted to a receiver transducer 30, which may also be a piezo transducer, having resonant frequency equivalent to that of generator transducer 24. The receiver transducer 30 is responsive to sound waves from generator transducer 24 to convert their mechanical energy to a variation in an electrical property so that an electrical output signal can be generated. Transducers 24 and 30 are preferably fixtured in a housing with a gap between them as shown in FIG. 2 where this housing is installed in the bilge hold of a marine vessel.

The magnitude of the sound waves received at transducer 30 is a function of the magnitude of the signal produced by the generator transducer 24 in combination with the medium through which the sound waves are transmitted. While the magnitude of the signal produced by the generator transducer 24 can be varied by adjusting potentiometer 28 of amplifier 22 coupled to the generator transducer 24, the medium through which the sound waves are transmitted is dependent upon the location of the housing, and the presence or absence of liquid in the bilge. The presence of liquid as opposed to air as a transmission medium results in an enhanced transmission of the acoustic signal to the receiver transducer 30. Thus, by adjusting potentiometer 26 such that a signal of sufficient magnitude is received at the receiver transducer 30 if liquid is the transmission medium, and a signal of insufficient magnitude is received at the receiver transducer 30 if air is the transmission medium, the electronic circuit is reliably responsive to the presence or absence of liquid between the generator and receiver transducers 24 and 30. The threshold is set by potentiometer 48 to be intermediate this condition.

The sound waves received by a receiver transducer 30, are converted to an electrical output signal which is applied to a receiver amplifier 32. The output of amplifier 32 is passed to a phase-locked loop detector within chip 20. The phase-locked loop detector, in turn, provides an output under the condition that the frequency of the input signal from the amplifier 32 is equivalent to the frequency of the oscillator in chip 20, the frequency of the signal transmitted by the generator transducer 24. The phase-locked loop detector thus controls the circuit frequency sensitivity such that the circuit is responsive only to those acoustic signals of the same frequency produced by the generator transducer 24, thereby eliminating the possibility of false response due to acoustic signals generated by extrinsic sources such as engine noise or vibration.

When the condition is met that the frequency of the input to the phase-locked loop detector is equivalent to the frequency of the acoustic signal output by the generator transducer 24, the output of the phase-locked loop detector on chip 20, pin 8, shifts low, triggering a relay activation network 40 comprising a voltage follower and delay generator 42 and 45, a voltage comparator 44 and a switching transistor 46. Voltage follower 42 receives the output from pin 8 through a diode 43 and applies its output to the input of a comparator 44. Amplifier 42 has a large shunt capacitive network 45 across its input. The network 45 discharges slowly with the low output from pin 8, delaying the recovery of amplifier 42. Conversely, when the PLL does not detect an input frequency, pin 8 of 20 goes high, slowly charging the capcitive network 45, causing a delay in switching of the relay (14). The capacitive network (45), voltage follower (42) and comparator (44) comprise a switch with hysteresis (40) allowing the switch to delay the response of the relay activation or deactivation to the onset or removal of the triggering signal fom the phase-locked loop.

Voltage comparator 44 receives the voltage output from voltage follower 42 on one input and has applied to it a reference threshold input set by a threshold potentiometer 48. The comparator circuit has a hysteresis set by a positive loop around it. The comparator 44 output is applied to the base of grounded emitter switching transistor 46 which has the relay coil of relay 14 tied to its collector. Thus, in response to detection of a signal by transducer 30, the outputs of amplifiers 42 and 44 go respectively low and high, activating the switching transistor 46 to allow current to flow through relay coil of relay 14, thereby closing relay contacts and connecting the pump motor 16 to the battery 12. When water is pumped below the level of transducers 24 and 30 the signal is removed from the transducer 30. Network 45 slows the change at the input of amplifier 42, allowing the output to stay below the threshold of the input to amplifier 44 long enough to keep relay 14 and pump 16 activated so as to remove more water from the bilge; this avoids constant on, off action of the pump.

A perspective view of a housing for the present invention is shown in FIG. 2 where the generator and receiver transducers 24 and 30 are shown in proximate and opposed relation to one another. The transducers are separated by a gap 52 and mounted on opposing cheeks of an acoustically insulative housing 50 which encapsulates the electronic circuit (typically excluding pump 16 and possibly relay 14) in a liquid impermeable environment. As an alternate embodiment, the transducer pair can be mounted on a housing as shown and electronically coupled to the corresponding electronic circuitry which is physically isolated from the transducer pair.

The housing of the present invention as shown in FIG. 2 is physically shaped to create a unidirectional flow of fluid through the gap 52 separating the transducer pair 24 and 30. This shape is also functional in relation to a mounting plate 54 to permit the user to adjust the positioning of the switch as well as remove it for inspection and/or cleaning.

The sonic bilge pump switch of the present invention permits the non-mechanical detection of rthe presence of fluid in a bilge hold for activating a bilge pump. The embodiment shown is exemplary only and the scope of the present invention is not to be limited by what has been particularly shown and described except as indicated by the claims which follow.

What is claimed is:

1. An apparatus for activating and deactivating a bilge pump in response to the detection of the presence or absence of fluid in a bilge hold, comprising:
   oscillator means for producing a periodic signal having a predetermined frequency to energize a first transducer means;
   first transducer means for converting said periodic signal to an acoustic signal and operative to transmit said acoustic signal;
   second transducer means for receiving said acoustic signal and operative to convert said acoustic signal to an electrical signal upon the condition that the magnitude of said acoustic signal exceeds a predetermined magnitude, said predetermined magnitude indicating the presence of fluid between said first and second transducer means;
   detector means coupled to said second transducer means and said oscillator means, for detecting whether said received acoustic signal is of the same frequency as said predetermined frequency, and for producing an electrical trigger signal in response thereto; and
   switch means coupled to said detector means for receiving said electrical trigger signal and connecting a bilge pump to a voltage source.

2. The apparatus of claim 1, further including activation circuit means coupled to said detector means, for receiving said electrical trigger signal and energizing said switch means, connecting said bilge pump to the voltage source.

3. The apparatus of claim 2 further including voltage regulator means for producing a voltage signal; and means, coupled to said voltage signal for generating a predetermined reference voltage.

4. The apparatus of claim 3, wherein said activation circuit comprises:
   buffer means responsive to said electrical trigger signal and operative to produce a time delayed output signal; and
   comparator means coupled to said buffer means for comparing said time delayed output signal to said predetermined reference voltage and energizing said switch means.

5. The apparatus of claim 1 including a waterproof housing means, wherein said housing means comprises a unitary structure for mounting said first and second transducer means in proximate and opposing relation to one another and wherein the remainder of said apparatus is enclosed within said waterproof housing means.

6. The housing means of claim 5, further including an independent mounting plate for securing said housing means on said mounting plate in a location within a bilge hold of a marine vessel.

7. The housing means of claim 5, wherein only said first and second transducer means are mounted on said housing means and the remainder of said apparatus is located in a physically independent unit which is electronically coupled to said first and second transducer means.

8. The apparatus of claim 1, further including a housing for fixturing said first and second transducer means in facing relationship across a gap open to the bilge.

9. The apparatus of claim 1, wherein said detector means is a phased-locked loop detector.

10. The apparatus of claim 1, wherein said first and second transducer means comprise a piezo-electric material.

* * * * *